United States Patent [19]

Deissner et al.

[11] Patent Number: 5,510,139
[45] Date of Patent: Apr. 23, 1996

[54] PROCESS FOR ASSEMBLY AND BONDING OF ELECTRONIC COMPONENTS ON AN INSULATING SUPPORT

[75] Inventors: Erich Deissner, Schwelm; Jonathan D. H. Hammond, Solingen; Dieter Meier, Gevelsberg, all of Germany

[73] Assignee: AMEG Additive Metallisierung-Entwicklunge-und Anwendungssesellshaft GmbH, Ennepetal, Germany

[21] Appl. No.: 136,010

[22] Filed: Oct. 14, 1993

[30] Foreign Application Priority Data

Oct. 16, 1992 [DE] Germany ............... 42 35 019.0

[51] Int. Cl.⁶ .................................................. B05D 5/12
[52] U.S. Cl. ........................... 427/97; 427/98; 29/830; 156/299; 156/305
[58] Field of Search ..................... 427/97, 98; 29/830; 156/299, 305

[56] References Cited

U.S. PATENT DOCUMENTS

| | | | |
|---|---|---|---|
| 4,910,045 | 3/1990 | Giesecke | 427/98 |
| 5,095,627 | 3/1992 | Bujagec | 361/783 |
| 5,144,742 | 9/1992 | Lucas | 29/830 |
| 5,167,992 | 12/1992 | Lin | 427/98 |
| 5,182,135 | 1/1993 | Giesecke | 427/98 |
| 5,238,702 | 8/1993 | Giesecke | 427/123 |

FOREIGN PATENT DOCUMENTS

| | | |
|---|---|---|
| 981797 | 1/1976 | Canada . |
| 0256395B1 | 2/1988 | European Pat. Off. . |
| 0322641 | 12/1988 | European Pat. Off. . |
| 0322641B1 | 7/1989 | European Pat. Off. . |
| 2330161 | 12/1974 | Germany . |
| 2835015 | 10/1978 | Germany . |
| 3932017A1 | 5/1990 | Germany . |
| 4004068A1 | 8/1991 | Germany . |

OTHER PUBLICATIONS

Patent Abstracts of Japan Publication No. JP1051693, Publication date Feb. 27, 1989.
Patent Abstracts of Japan Publication No. JP4144143, Publication date May 18, 1992.
Patent Abstracts of Japan Publication No. 2307292, Publication date Dec. 20, 1990.
IBM Technical Disclosure Bulletin—vol. 32, No. 12, May 1990.
Paper delivered by W. Schmidt at the Third European Joint Conference, Jun. 17–18, 1992, Brussels.
Reprint: "Mikroperipherik" [Microperipherals], Oct. 1990, by H. Reichl.
Jacobs, S. L., Guthrie, W. E.: "A New Multichip Interconnect Technology,", Proc. 1989.
Casson, K., Gibson, B., Habeck, K.: Paper delivered at Third European Joint Conference, Jun. 17–18, 1992, Brussels.

*Primary Examiner*—Shrive Beck
*Assistant Examiner*—Brian K. Talbot
*Attorney, Agent, or Firm*—Antonelli, Terry, Stout & Kraus

[57] ABSTRACT

In a process for assembly and bonding of electric and/or electronic components (3), provided with metal connections (11), on an insulating support (1) to be provided with strip conductors, it is provided, to increase the economic efficiency, that a catalyst (7) for currentless metal deposition is applied on support (1) first in the area of the strip conductor structure, that components (2) are positioned with their metal connections (11) on the assigned strip conductor points of support (1) and that then, by currentless metal deposition from a chemical metallization bath, bonding (13, 14) of metal connections (11) is performed simultaneously with the formation of metallic strip conductors (5).

6 Claims, 1 Drawing Sheet

PROCESS FOR ASSEMBLY AND BONDING OF ELECTRONIC COMPONENTS ON AN INSULATING SUPPORT

FIELD OF THE INVENTION

The invention relates to a process for assembly and bonding of electric and/or electronic components, provided with metal connections, on an insulating support to be provided with strip conductors.

The process according to the invention is to be used primarily in connection and interconnection engineering (ATV) with semiconductor technology, when electrically conducting interconnections of electronic components, e.g., Si-circuits, are to be produced for the peripheral environment or below one another and when components below one another are also to be interconnected adhesively at the same time.

DESCRIPTION OF THE PRIOR ART

With the rapid development of microelectronics, in view of complex circuits with more than 500,000 transistors and with clock pulse rates above 100 MHz new methods of AVT are necessary.

The increasing degree of integration, the high transmission speeds, low capacitances as well as properly proportioned thermal behavior, combined with high reliability, require I/O groupings of more than 500 and are no longer economically achievable with usual AVT technologies.

A special discrepancy becomes apparent between, on the one hand, semiconductor development/chip manufacturing and, on the other hand, housing technology (packaging). While with semiconductor manufacturing, problem-free connection groupings >500 are achieved by reducing the connection grid to ≦1 micron, current interconnection technologies, e.g., bonding, soldering, are limited, and it is necessary to turn to new AVT methods to solve packaging problems.

In this connection, MCM technology (multichip-module technology) represents an already known technical solution, in which three categories of multichip modules can currently be distinguished:

a) MCM/C technology: Here, ceramic substrates or unsintered ceramic films (green tape) are used, which guarantee a multichip/multilayer design by lamination of up to 30 individual layers.

In the meantime, low-sintering ceramic (about 850° C.) is also used, to be compatible with the offered thick film paste.

b) MCM/D technology: As base materials, ceramic, metal and silicon are used and applied on alternately conducting and insulating layers, similar to Si-wafer production.

c) MCM/L technology: This technology starts from insulation materials combined with plastic such as rigid and flexible printed circuit boards and uses microconductor structures with coats of film or paint for multilayer designs.

Further, TAB (Tape-Automated-Bonding) represents a standard technology for microinterconnection engineering, in which the aluminum bonding surfaces of IC chips have to be provided with raised bumps made of gold. The numerically controlled wire bonding machines necessary for this purpose require high investment costs.

Similarly economical is COB (chip on board) technology, which achieves microinterconnections also by the wire bonding.

Another technologically expensive method is flip-chip assembly, in which the electric contact is closed, without using bonding wires, by the applied bumps with microsoldering. This technology requires selected material combinations (diffusion barriers) on the soldering joints and is greatly limited in reliability by electrochemical potential formation relative to climate and service life behavior.

In the report of W. Schmidt, "A revolutionary answer to today's and future interconnect challenges," report on the "Third European Joint Conference 6/17–18/1992," Brussels, it is explained how to increase significantly the packing density and the connection grid by polyimide films in which, by plasma etching, simultaneously all through-holes are produced in one work step.

In the bibliographic reference of Reicht, H., "Silizium Substrate fur die AVT" [Silicon Substrates for the AVT], Aufbau und verbindungstechnik [Mounting and Connection Engineering], sonderdruck "Mikroperipherik" [offprint "Microperipherals"], October 1990, p, 17, it Is attempted, on the other hand, to use silicon as a support material for Ic circuits and to fasten and to bona wafers adhesively and in an electrically conducting way by "anodic bonding" at temperatures of 390°–450° C.

In the bibliographic reference of Jacobs, S. L.; Guthrie, W. E "A New Multichip Interconnect Technology," Proc. 1989 Int. Electron. Packaging Symp, pp. 339–354, a multichip interconnection technology is represented, which uses glass as an intermediate support and uses polyimide as an insulator, which can be provided with holes by dry etching. The produced holes (vias) are then filled with aluminum, to thus provide electrically conducting interconnections to the chip.

Casson, K.; Gibson, B.; Habeck, K., "Flip-on-flex: Soldered bumped IC's bond to NOVOCLAD—a new temperature, adhesiveless, flex material," report on the "Third European Joint Conference 6/17–18/1992," Brussels, deal with a similar technology. Here, it is proposed to coat the bonding pads on the Si chip, which usually are coated with aluminum or gold for the bonds, with solderable materials, and to interconnect these chips (bump technologies) with, e.g., flexible materials (soldering process).

In DE 40 04 068 A1, a process for bonding electronic components is described, in which the electronic component is positioned with its connections on the already formed, assigned strip conductors of the support, after which the connections of the electronic component are opened by etching. Then, the bonding of the connections by currentless metal deposition takes place, and simultaneously conductor interconnections to the connections are formed.

DE-OS 23 30 161 characterizes the current technological status of interconnection technology by two planes with the help of galvanic processes (through-hole plating). The electronic component can be electrically bonded, for example, by flip-chip assembly.

By DE 39 32 017 A1, it is further known to use a screen printing paste having a catalytic effect for the production of printed circuit boards, on which strip conductors can be applied by currentless metal deposition.

All above-mentioned technologies are very complex, difficult to control, therefore connected with high costs and usable only to a very limited extent for new circuit generations, e.g., ASIC's, especially if the connections are present not only on the outside edges of the electronic components. Thus, for example, an electric bonding of connections that are distributed over the entire surface (land arrays) can no longer De performed according to the above-mentioned DE 40 04 068 A1.

Therefore, trend-setting interconnection technologies have to be provided which economically meet the set requirements.

SUMMARY OF THE INVENTION

The object of the invention is to indicate, by using proven technologies, a reliable bonding process that also is suitable for electronic components with very high connection numbers and can be used economically above all in AVT of microperipherals while technology steps, such as, e.g., bonding, soldering, microwelding, but while maintaining usual basic technologies and by meeting recognized specifications.

To achieve this object, it is provided according to the invention that a catalyst for currentless metal deposition is applied on the support first in the area of the strip conductor structure, that the components are positioned with their metal connections on the assigned strip conductor points of the support and that then the bonding of the metal connections is performed simultaneously with the formation of the metallic strip conductors by currentless metal deposition from a chemical metallization bath.

In this connection, it has an especially economical effect that the strip conductor design and the bonding are performed in only one technology step.

The high mechanical adhesion of the metal-plastic bond, which is achieved by using special catalysts (EP 0 322 641 B1, DE 39 32 017 A1) is advantageous.

In the further development of the invention, it can be provided that, in the case of components to be bonded through holes of the support, also the walls of the holes first are coated with the catalyst, that the components are positioned with their connections on the related holes and that then the bonding of the connections takes place simultaneously with the metallization of the hole walls and the formation of the metallic strip conductors.

In the case of supports to be equipped on both sides, it can be provided, according to the invention, that the support is provided first on both sides with the catalyst in the area of the strip conductor structures and then is equipped on both sides with the components, and that then the bonding of the components and the formation of the metallic strip conductors are performed simultaneously by currentless metal deposition.

The process according to the invention is distinguished by a great economic efficiency and an almost universal usability within connection and interconnection engineering in semiconductor technology. Active components such as IC's or else passive components such as resistors or condensers can be bonded in the same way with simultaneous formation of strip conductors. In this connection, the high adhesive strength of the metal depositions on the support and on the components is especially advantageous. Both rigid and flexible supports can be used.

According to the invention, bathe can be used for the currentless metal deposition, which respectively contain one of the following metals or metal combinations chem. nickel,
chem. copper,
chem. gold,
chem. silver,
chem. silver/palladium,
chem. tin/lead, The "currentless copper bath" sold by the Dermid company, Waterbury, Connecticut, USA, is preferably used.

The production of electric microinterconnections requires of the electronic components a metal which, corresponding to its position in the electrochemical series, makes currentless metal deposition, e.g., nickel or gold, possible. Galvanically problematic metals (such as, e.g., aluminum or the like) have to be coated in advance with galvanically active metals, e.g., by a suitable chemical bath.

As a catalyst, advantageously the catalyst sold by the company Bayer AG, Leverkusen, under the protected trademark "Bayprint" is used in the process according to the invention (Patent in this respect EP 0 256 395B1, EP 0 322 641B1).

BRIEF DESCRIPTION OF THE DRAWING

The process according to the invention is explained in more detail below based on the drawing, in which are shown:

FIG. 1 shows a support 1, in which a rigid plastic plate or a flexible plastic film, e.g., made of polyimide or polyester, is involved. Support 1 is equipped on its top side with electronic components 2, 3, which are to be bonded with strip conductors 4, 5, which are located partly (represented in solid lines) on the top side of the support, partly (represented in dotted lines) on the bottom side of the support.

FIG. 2 illustrates the achievement of the process according to the invention with the bonding of a component 2 with a strip conductor 4 to be formed on the top side of the support. As an example, a cased component SMD (surface-mounted device) is shown here, which is provided on the edge with metal connections 6.

Figure 1:
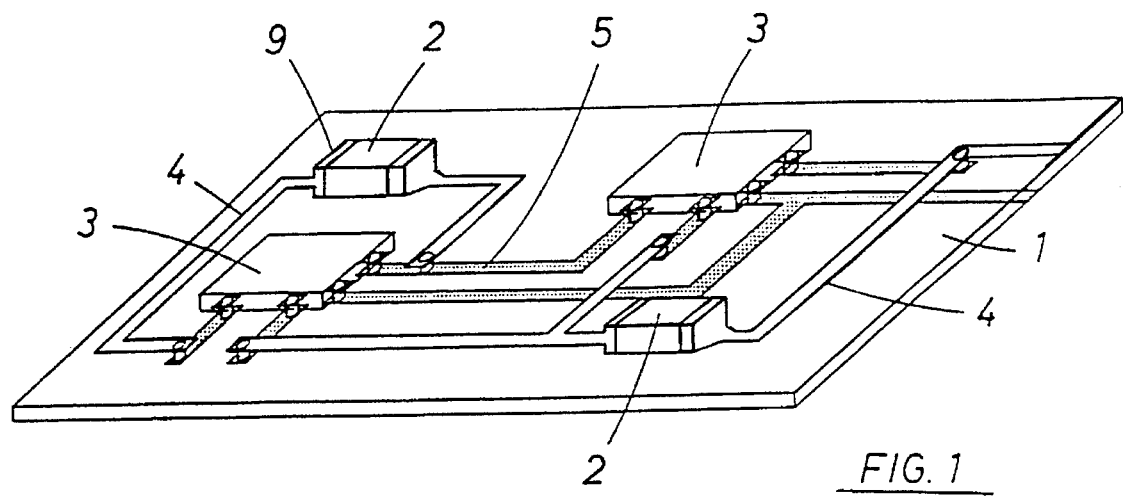
FIG. 1 illustrates a support equipped with electronic components.
Figure 2:
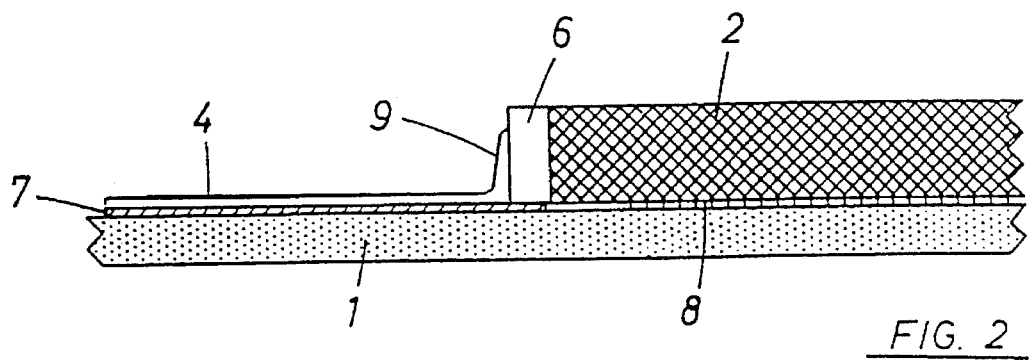
FIG. 2 illustrates the assembly and bonding of a component with a strip conductor to be formed on the top side of the support.

In a first work step, a catalyst 7 corresponding to the strip conductor pattern is applied on the top side of support 1, which can be performed by linear printing or photochemical treatment of a catalyst applied on the entire surface by using a mask. As catalysts, e.g., the screen printing pastes indicated in DE 39 32 017 A1 under examples 1, 2 and 5 can be used. Then, component 2 is positioned on support 1 and attached, e.g., by an adhesive 8, and metal connection 6 is aligned with the related "strip conductor" prepared by catalyst 7.

In another work step, equipped support 1 is then brought into a chemical metal bath, e.g., a copper bath containing formalin. After a suitable exposure time at selected bath parameters, especially rate of deposition, redox potential, a metallic, electrically conducting bonding 9 is made between metal connection 6 and metallic strip conductor 4, simultaneously being formed by metal deposition.

Figure 3:
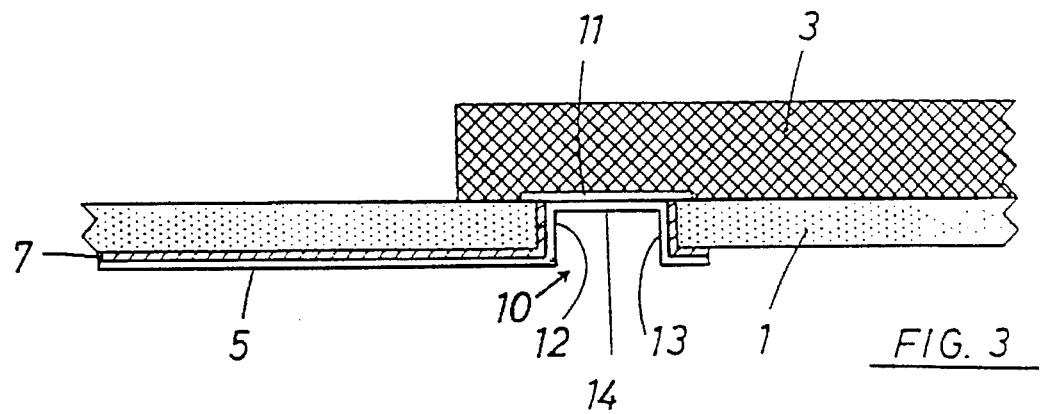
FIG. 3 illustrates the assembly and bonding of a component with a strip conductor to be formed on the bottom side of the support.

FIG. 3 illustrates the bonding of component 3 with a strip conductor 5 to be formed on the bottom side of support 1. Support 1 is provided with microholes 10 that are e.g., 50 microns in diameter, e.g., by laser beams, Component 3 here involves an uncased chip (flip-chip) that exhibits a multiplicity of connections 11 on its bottom side, which involve so-called connection spots (pads) with an edge length of 70 to 100 microns.

In a first work step, a catalyst 7 is applied on the lower side of the support corresponding to the strip conductor pattern. Here, catalyst 7 is applied at the same time on wall 12 of holes 10. Then, component 3 is positioned with its connection spots 11 on holes 10, so that the "strip conductors" prepared by the catalyst also applied on wall 12 reach up to connecting spots 11. Then, strip conductors 5, metallic hole-lining 13 and bonding 14 with connecting spots 11 are formed by currentless metal deposition in a copper bath. The layer thickness of the metal deposition is preferably 1 to 3 microns.

The metal depositions on strip conductor 5, the wall of hole 10 and on connecting spots 11 have a great adhesive strength, so that in view of the generally many hundreds of connecting spots 11 of component 3 to be bonded, these metal depositions are sufficient to attach the component permanently on support 1. Instead of an attachment by an adhesive, a temporary attachment, e.g., clamping, of the component on support 1 during the currentless metal deposition is therefore sufficient.

If, as in the embodiment according to FIG. 1, both support sides are to be equipped and provided with strip conductors, catalyst 7 is first to be applied on both sides, components 2 and 3 are then positioned on both sides and subsequently, the described currentless metal depositions are performed simultaneously on both sides.

List of Reference Symbols 1 support
2 component
3 component
4 strip conductor
5 strip conductor
6 metal connection
7 catalyst
8 adhesive
9 bonding
10 microhole
11 connection
12 wall
13 hole lining
14 bonding

We claim:

1. A process for assembly and bonding of uncased electrical components provided with metal connections on an area of an insulating support to be provided with strip conductors comprising:

applying a catalyst for a currentless metal deposition on the insulating support in the area of the insulating support where the strip conductors are to be provided;

providing holes through the insulating support with walls of the holes through the insulating support being coated with the catalyst;

positioning the uncased electrical components with their metal connections in registration with the holes; and bonding by currentless metal deposition from a chemical metallization bath the metal connections in registration with the walls of the holes and the walls of the holes simultaneously with the forming of the metallic strip conductors wherein the bonding of the metal connections has a dimension along the connections of no more than 100 microns.

2. A process according to claim 1 wherein:

the bath is a currentless metal deposition bath containing a metal or metals selected from the group consisting of nickel, copper, gold, silver, silver/palladium, and tin/lead.

3. A process for printed circuit board production, assembly and bonding of uncased electronic components by currentless metal deposition comprising:

providing a support with holes which correspond to spatial arrangements of bonds of the uncased electronic components;

applying a catalyst for currentless metal deposition at locations provided on the support for formation of strip conductors and formation on walls of the holes;

positioning the uncased electronic components with their bonds in registration with the holes; and forming by currentless metal deposition the strip conductors on the catalyst applied to the support simultaneously with formation of an electrically conducting metal layer on the walls of the holes and the bonds of the uncased electronic components wherein the bonds have a dimension along the electrically conducting metal layer in the holes of no more than 100 microns.

4. A process according to claim 3 wherein:

the bath is a currentless metal deposition bath containing a metal or metals selected from the group consisting of nickel, copper, gold, silver, silver/palladium, and tin/lead.

5. A process for assembly and bonding of uncased electrical components provided with metal connections on an area of an insulating support to be provided with strip conductors comprising:

applying a catalyst to two sides of the insulating support for a currentless metal deposition on the insulating support in the area of the insulating support where the strip conductors are provided;

providing holes through the insulating support with walls of the holes through the insulating support being coated with the catalyst;

positioning the uncased electrical components with their metal connections in registration with the holes on the two sides of the insulation support;

bonding by currentless metal deposition from a chemical metallization bath the metal connections in registration with the walls of the holes and the walls of the holes simultaneously with the forming of metallic strip conductors;

wherein the bonding of the metal connections has a dimension along the connections of no more than 100 microns.

6. A process according to claim 5 wherein:

the bath is a currentless metal deposition bath containing a metal or metals selected from the group consisting of nickel, copper, gold, silver, silver/palladium, and tin/lead.

* * * * *